United States Patent
Chi et al.

(10) Patent No.: US 9,059,825 B2
(45) Date of Patent: Jun. 16, 2015

(54) RECEIVER, SYSTEM INCLUDING THE SAME, AND CALIBRATION METHOD THEREOF

(71) Applicants: SK HYNIX INC., Icheon (KR); Seoul National University R&DB Foundation, Seoul (KR)

(72) Inventors: Han-Kyu Chi, Seoul (KR); Taek-Sang Song, Seoul (KR); Seok-Min Ye, Seoul (KR); Gi-Moon Hong, Seoul (KR); Woo-Rham Bae, Seoul (KR); Min-Seong Chu, Seoul (KR); Deog-Kyoon Jeong, Seoul (KR); Su-Hwan Kim, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 14/498,296

(22) Filed: Sep. 26, 2014

(65) Prior Publication Data

US 2015/0139289 A1    May 21, 2015

(30) Foreign Application Priority Data

Nov. 20, 2013  (KR) ........................ 10-2013-0141230

(51) Int. Cl.
*H04B 3/46*  (2006.01)
*H04L 7/00*  (2006.01)
(Continued)

(52) U.S. Cl.
CPC ............ *H04L 7/0041* (2013.01); *H04L 7/0087* (2013.01); *H04L 7/0337* (2013.01); *H03K 5/131* (2013.01); *H03K 5/135* (2013.01); *H03K 2005/0011* (2013.01)

(58) Field of Classification Search
CPC ....... H04L 7/00; H04L 7/0008; H04L 7/0016; H04L 7/0033; H04L 7/0037; H04L 7/0045; H04L 7/005; H04L 7/0079; H04L 7/0087
USPC ......... 375/224, 226, 228, 316, 295, 219, 222, 375/220, 354, 355, 371, 372
See application file for complete search history.

(56) References Cited

U.S. PATENT DOCUMENTS

| | | | |
|---|---|---|---|
| 7,057,418 B1* | 6/2006 | Fu et al. | 327/3 |
| 2005/0111602 A1* | 5/2005 | Suda et al. | 375/355 |

(Continued)

OTHER PUBLICATIONS

Sang-Hye Chung et al., "An 8Gb/s Forwarded-Clock I/O Receiver with up to 1GHz Constant Jitter Tracking Bandwidth Using a Weak Injection-Locked Oscillator in 0.13 μm CMOS", 2011 Symposium on VLSI Circuits Digest of Technical Papers, 2011, pp. 84-85.

(Continued)

*Primary Examiner* — Siu Lee

(57) ABSTRACT

A receiver includes a fixed delay unit configured to delay a first clock signal received from a clock channel by a predetermined time and output a second clock signal; a first delay unit configured to delay the first clock signal in response to a first control signal; a first data sampler configured to sample a data signal received from a data channel in response to an output signal of the first delay unit and output a first data signal; a second delay unit configured to delay the first data signal in response to a second control signal and output a second data signal; a second data sampler configured to sample the second data signal in response to the second clock signal; and a delay controller configured to output the first control signal and the second control signal.

18 Claims, 13 Drawing Sheets

(51) Int. Cl.
*H04L 7/033* (2006.01)
*H03K 5/13* (2014.01)
*H03K 5/135* (2006.01)
*H03K 5/00* (2006.01)

(56) References Cited

U.S. PATENT DOCUMENTS

2009/0290671 A1    11/2009  Rea et al.
2014/0070864 A1*   3/2014   Kossel et al. ............... 327/271

OTHER PUBLICATIONS

Ganesh Balamurugan et al., "A Scalable 5-15 Gbps, 14-75 mW Low-Power I/O Transceiver in 65 nm CMOS", IEEE Journal of Solid-State Circuits, Apr. 2008, pp. 1010-1019, vol. 43, No. 4.

B. Casper et al., "A 20Gb/s Forwarded Clock Transceiver in 90nm CMOS", 2006 IEEE International Solid-State Circuits Conference, Feb. 6, 2006, pp. 1-10.

Frank O'Mahony et al., "A 27Gb/s Forwarded-Clock I/O Receiver Using an Injection-Locked LC-DCO in 45nm CMOS", 2008 IEEE International Solid-State Circuits Conference, Feb. 6, 2008, pp. 452-453, 627.

Thomas Toifl et al., "A 0.94-ps-RMS-Jitter 0.016-mm$^2$ 2.5-GHz Multiphase Generator PLL with 360° Digitally Programmable Phase Shift for 10-Gb/s Serial Links", IEEE Journal of Solid-State Circuits, Dec. 2005, pp. 2700-2712, vol. 40, No. 12.

Frank O'Mahony et al., "A 47 x 10 Gb/s 1.4 mW/Gb/s Parallel Interface in 45 nm CMOS", IEEE Journal of Solid-State Circuits, Dec. 2010, pp. 2828-2837, vol. 45, No. 12.

Jared Zerbe et al., "A 5 Gb/s Link With Matched Source Synchronous and Common-Mode Clocking Techniques", IEEE Journal of Solid-State Circuits, Apr. 2011, pp. 974-985, vol. 46, No. 4.

* cited by examiner

RECEIVER, SYSTEM INCLUDING THE SAME, AND CALIBRATION METHOD THEREOF

CROSS-REFERENCE TO RELATED APPLICATIONS

The present application claims priority to Korean Patent Application No. 10-2013-0141230, filed on Nov. 20, 2013, which is incorporated herein by reference in its entirety.

BACKGROUND

1. Field

Embodiments of the present disclosure relate to a receiver used in a system in which a data channel and a clock channel are separate from each other, a system including the same, and a calibration method thereof.

2. Description of the Related Art

Data communication methods include a method in which a data channel and a clock channel are implemented using a single channel and a method in which a data channel and a clock channel are separate from each other.

In the latter method, a larger area is occupied by channels because the data channel and the clock channel are separate from each other. Moreover, in a system using a plurality of data channels, it is important to correct a data skew for each of the data channels.

A conventional receiver generates a multi-phase clock signal from a clock signal transmitted through a clock channel, using a circuit such as a PLL (Phase Locked Loop) circuit, and distributes the multi-phase clock signal to each data channel. Then the multi-phase clock signals were mixed to generate sampling clock signals for data channels to correct data skews in the data channels.

In such a conventional receiver, the area and power consumption of the system is increased by the complexity of the circuit (e.g., the PLL circuit), and noise is increased by a transmission line for transmitting the multi-phase clock signal.

SUMMARY

Various embodiments are directed to a technique for correcting a data skew existing in a data channel without using a multi-phase clock signal generated by a PLL circuit, in a receiver used in a system including a data channel and a clock channel, which are separate from each other.

In an embodiment, a receiver may include: a fixed delay unit configured to delay a first clock signal received from a clock channel by a predetermined time and output a second clock signal; a first delay unit configured to delay the first clock signal in response to a first control signal; a first data sampler configured to sample a data signal received from a data channel in response to the output signal of the first delay unit and output a first data signal; a second delay unit configured to delay the first data signal in response to a second control signal and output a second data signal; a second data sampler configured to sample the second data signal in response to the second clock signal; and a delay controller configured to output the first control signal and the second control signal.

The delay controller may perform a calibration operation including determining the first and second control signals based on a pattern of data outputted from the second data sampler while a test signal is received from the data channel.

The delay controller may determine the first control signal to allow the first data sampler to sample a first point between adjacent edges of the test signal, and determines the second control signal to allow the second data sampler to sample a second point between adjacent edges of the second data signal.

In an embodiment, a system may include: a transmitter including a clock transmitter configured to transmit a clock signal to a clock channel and a data transmitter configured to transmit a data signal to a data channel; and a receiver including a clock receiver configured to receive a clock signal from the clock channel and a data receiver configured to receive a data signal from the data transmitter. The clock receiver may include a fixed delay unit configured to delay a first clock signal received from the clock channel by a predetermined time and output a second clock signal, and the data receiver may include: a first delay unit configured to delay and output the first clock signal in response to a first control signal; a first data sampler configured to sample a data signal received from the data channel in response to an output signal of the first delay unit, and output a first data signal; a second delay unit configured to delay the first data signal in response to a second control signal and output a second data signal; a second data sampler configured to sample the second data signal in response to the second clock signal; and a delay controller configured to output the first control signal and the second control signal.

In an embodiment, there is provided a calibration method of a receiver which includes a fixed delay unit configured to delay a first clock signal received from a clock channel for a predetermined time and output a second clock signal; a first delay unit configured to delay and output the first clock signal according to a first control signal; a first data sampler configured to sample a data signal received from a data channel in response to the output signal of the first delay unit and output a first data signal; a second delay unit configured to delay the first data signal according to a second control signal and output a second data signal; a second data sampler configured to sample the second data signal according to the second clock signal; and a delay controller configured to output the first control signal and the second control signal, wherein the delay controller determines the first control signal and the second control signal based on the pattern of data outputted from the second data sampler while a test signal is received from the data channel. The calibration method may include: a first step of determining a second signal $S_{2,k}$ which is likely to become the second control signal, when a first signal $S_{1,k}$ is provided as the first control signal where k ranges from 1 to N and N is a natural number equal to or more than 1; and a second step of selecting any one signal pair $S_m$ among a plurality of signal pairs $S_{1,k}$ and $S_{2,k}$ and determining the selected signal pair as the first control signal and the second control signal, where m ranges from 1 to N.

DETAILED DESCRIPTION

Figure 1:
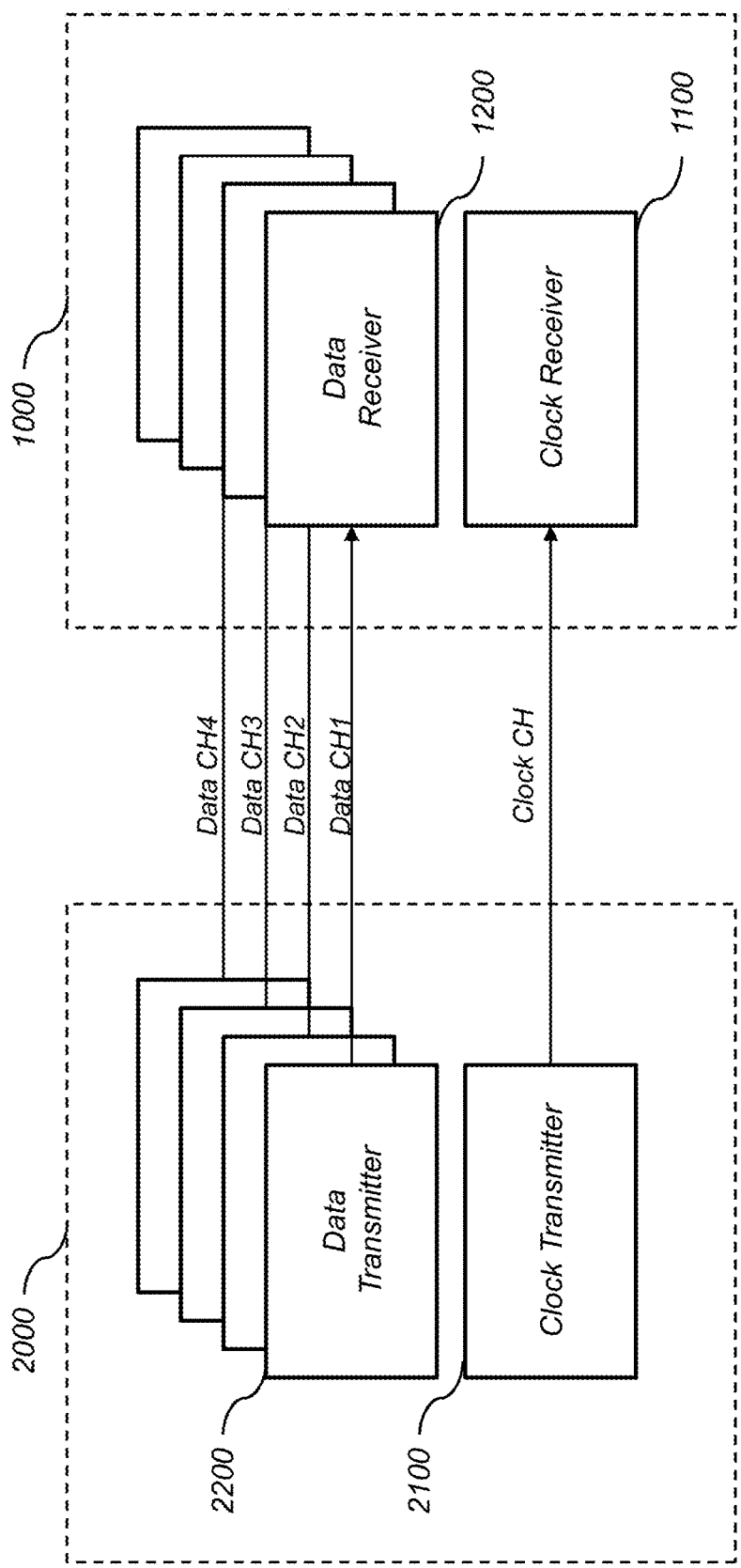
FIG. 1 illustrates a system in accordance with an embodiment of the present disclosure.

Various embodiments will be described below in more detail with reference to the accompanying drawings. The present invention may, however, be embodied in different forms and should not be construed as limited to embodiments set forth herein. Rather, these embodiments are provided so that the present disclosure will be thorough and complete. Throughout the present disclosure, like reference numerals refer to like parts throughout the various figures and embodiments of the present disclosure.

FIG. 1 illustrates a system in accordance with an embodiment of the present disclosure. The system includes a transmitter 2000 and a receiver 1000, which transmit and receive data through one clock channel and a plurality of data channels.

The receiver 1000 includes a clock receiver 1100 configured to receive a clock signal from the clock channel and a data receiver 1200 configured to receive a data signal from a data channel.

The transmitter 2000 includes a clock transmitter 2100 configured to transmit a clock signal to the clock channel and a data transmitter 2200 configured to transmit a data signal to a data channel. The transmitter 2000 may include any known transmitter. Accordingly, a detailed description thereof will be omitted for convenience of description.

Hereafter, a configuration and a method of operating the receiver 1000 will be described.

Figure 2:
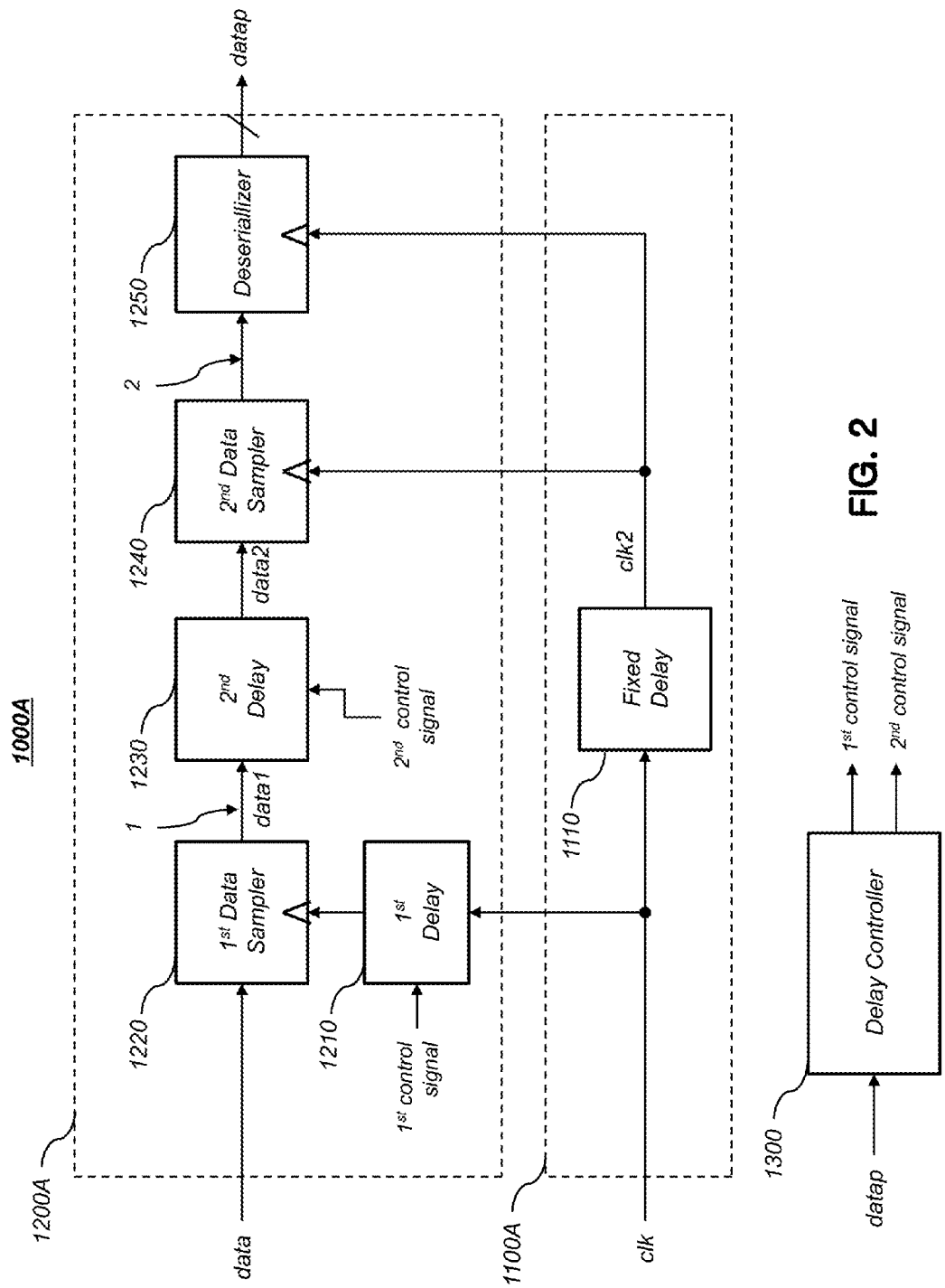
FIG. 2 illustrates a receiver in accordance with an embodiment of the present disclosure.

FIG. 2 illustrates a receiver 1000A in accordance with an embodiment of the present disclosure.

The receiver 1000A includes a clock receiver 1100A, a data receiver 1200A, and a delay controller 1300.

The data receiver 1200A may correspond to any one of a plurality of data channels. Thus, the receiver 1000A may include more data receivers each having substantially the same configuration as that of the data receiver 1200A as the number of data channels increases.

The clock receiver 1100A includes a fixed delay unit 1110 configured to delay a first clock signal clk by a predetermined delay time and output a second clock signal clk2.

The data receiver 1200A includes a first delay unit 1210, a first data sampler 1220, a second delay unit 1230, and a second data sampler 1240. The first delay unit 1210 delays the first clock signal clk in response to a first control signal. The first data sampler 1220 samples a data signal data, received from a data channel, in response to a delayed first clock signal from the first delay unit 1210, and outputs a first data signal data1. The second delay unit 1230 delays the first data signal data1 in response to a second control signal, and outputs a second data signal data2. The second data sampler 1240 samples the second data signal data2 in response to the second clock signal clk2.

The data receiver 1200A may further include a deserializer 1250 configured to convert an output signal of the second data sampler 1240 into a parallel data signal datap in response to the second clock signal clk2.

The delay controller 1300 outputs the first control signal and the second control signal. The delay controller 1300 may perform a calibration operation of determining the first and second control signals based on a pattern of the data signal outputted from the second data sampler 1240 while a test signal is inputted from the data channel.

When the data receiver 1200A includes the deserializer 1250, the pattern of the data signal, which is used in the calibration operation, may be determined based on the parallel data signal datap outputted from the deserializer 1250. That is, the parallel data signal datap outputted from the deserializer 1250 is input to the delay controller 1300.

Figure 3:
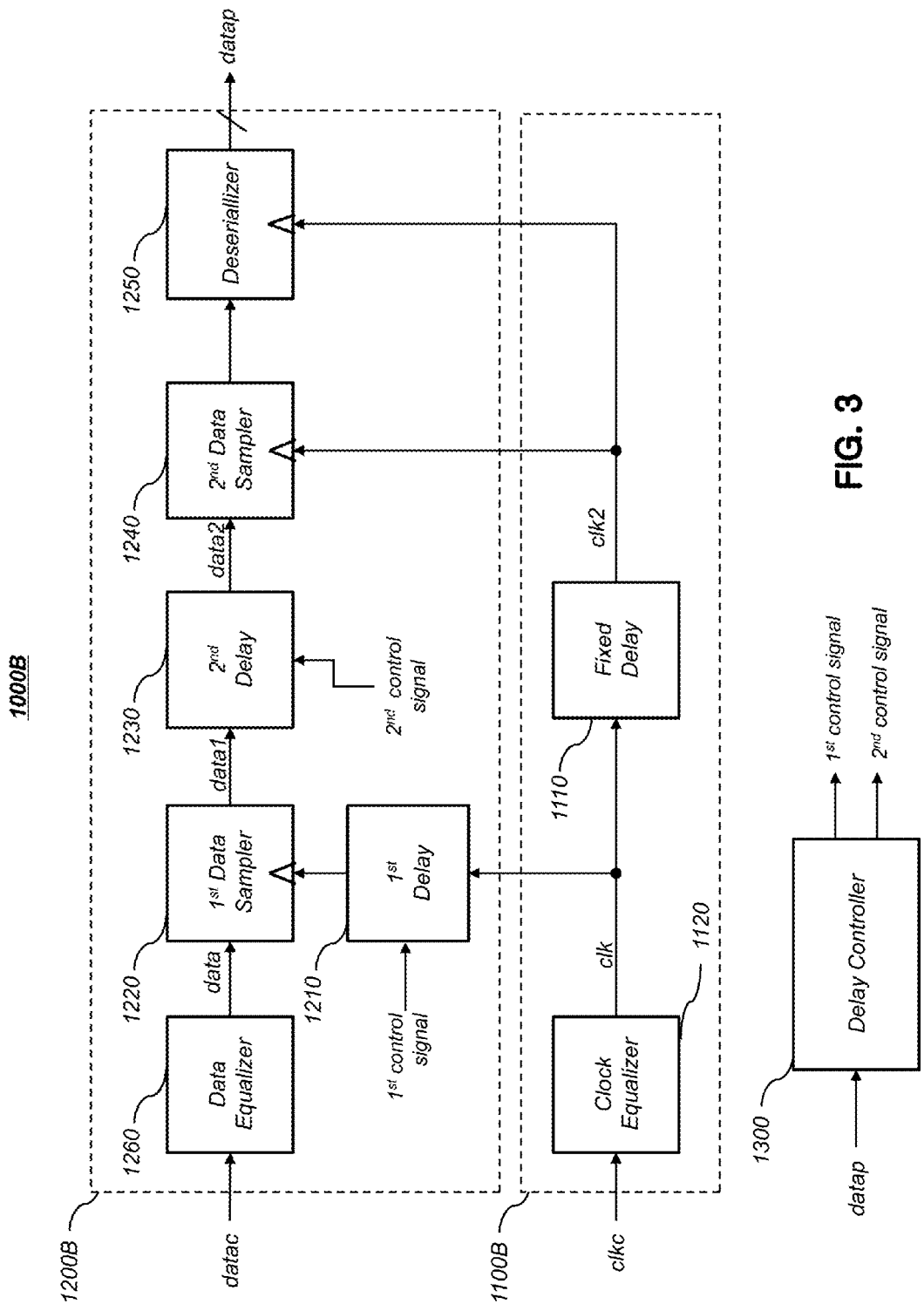
FIG. 3 illustrates a receiver in accordance with another embodiment of the present disclosure.

FIG. 3 illustrates a receiver 1000B in accordance with another embodiment of the present disclosure.

Compared to the receiver 1000A illustrated in FIG. 2, the receiver 1000B further includes a clock equalizer 1120 configured to equalize a signal clkc received from a clock channel and output a first clock signal clk and a data equalizer 1260 configured to equalize a data signal datac received from a data channel and output a data signal data. That is, the receiver 1000B of FIG. 3 is different from the receiver 1000A of FIG. 2 in that the receiver 1000B further includes the clock equalizer 1120 and the data equalizer 1260, but the other components of the receiver 1000B are substantially the same as those of the receiver 1000A. Thus, detailed descriptions for components or features that are substantially the same as those in the receiver 1000A of FIG. 2 may be omitted for simplicity of explanation.

The clock equalizer 1120 and the data equalizer 1260 may be implemented with known equalizers. In an embodiment, one or more of known equalizers such as a continuous time equalizer (CTLE) and a decision feedback equalizer (DFE) may be used to implement the clock equalizer 1120 and the data equalizer 1260.

Figure 4:
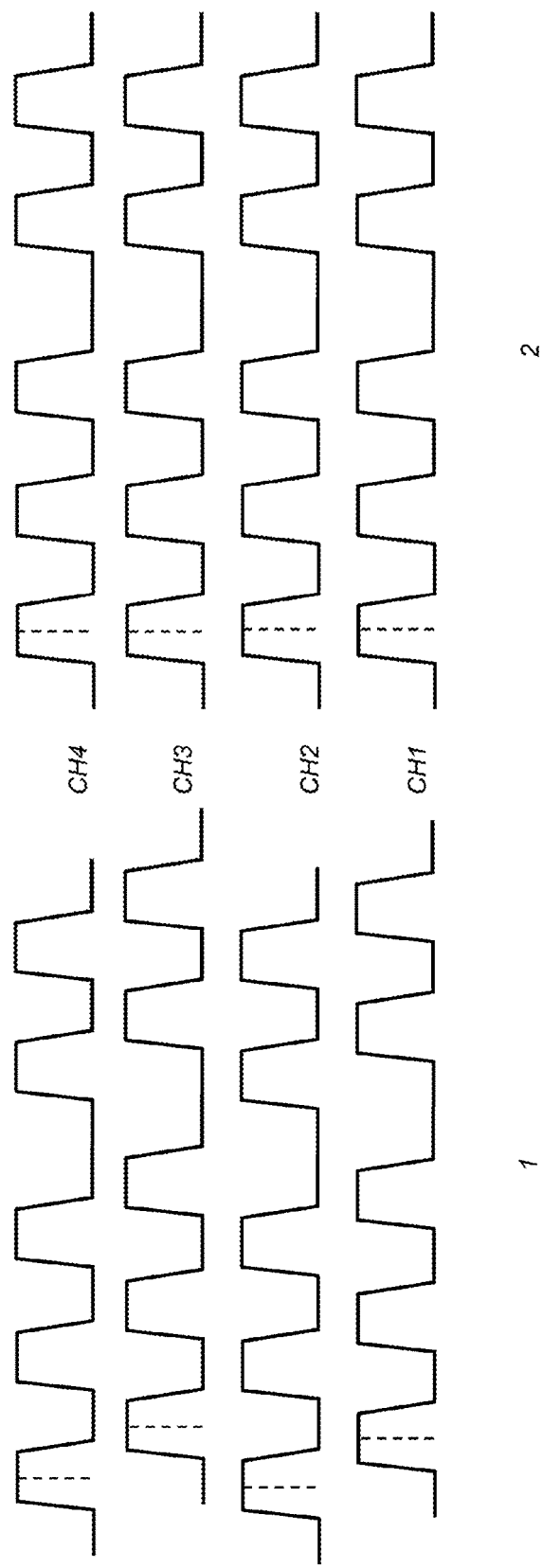
FIG. 4 is a waveform diagram showing a skew correction in a receiver in accordance with an embodiment of the present disclosure.

FIG. 4 illustrates waveforms of data signals on respective data channels before and after the skewed data signals are corrected.

As illustrated in FIG. 4, first data signals data1 outputted from the first data sampler 1220 of FIG. 2 may contain different skews on the respective data channels CH1 to CH4. However, after the first data signals data1 pass through the second data sampler 1240, the skews of the first data signals data1 of the respective data channels CH1 to CH4 may be corrected to have a constant value. The waveforms on the left side of FIG. 4 show data signals before the skews are corrected, and the waveforms on the right side of FIG. 4 show data signals after the skews are corrected.

In order to correct the different skews on the respective data channels CH1 to CH4, a calibration operation is performed by a data receiver such as the data receiver 1200A or 1200B corresponding to each data channel.

The calibration operation is performed based on results of an operation of the delay controller 1300 that determines the first and second control signals. As the first and second control signals are determined by the delay controller 1300, the length of the delay of the first and second delay units 1210 and 1230 are determined in response to the first and second control signals, respectively.

FIGS. 2 and 3 illustrate that the delay controller 1300 outputs a single first control signal and a single second control signal. However, if there are a plurality of data channels and a plurality of data receivers corresponding to the respective data channels, the delay controller 1300 may output first and second control signals for each of the data receivers.

The length of the delay of the fixed delay unit 1110 may be set to a predetermined value, and is not changed in a normal receiving operation or in the calibration operation.

Hereafter, referring to FIG. 5, a calibration operation of the delay controller 1300 will be described. If there is a plurality of data channels, the calibration operation may be independently performed on each data receiver coupled to a corresponding one of the data channels.

Figure 5:
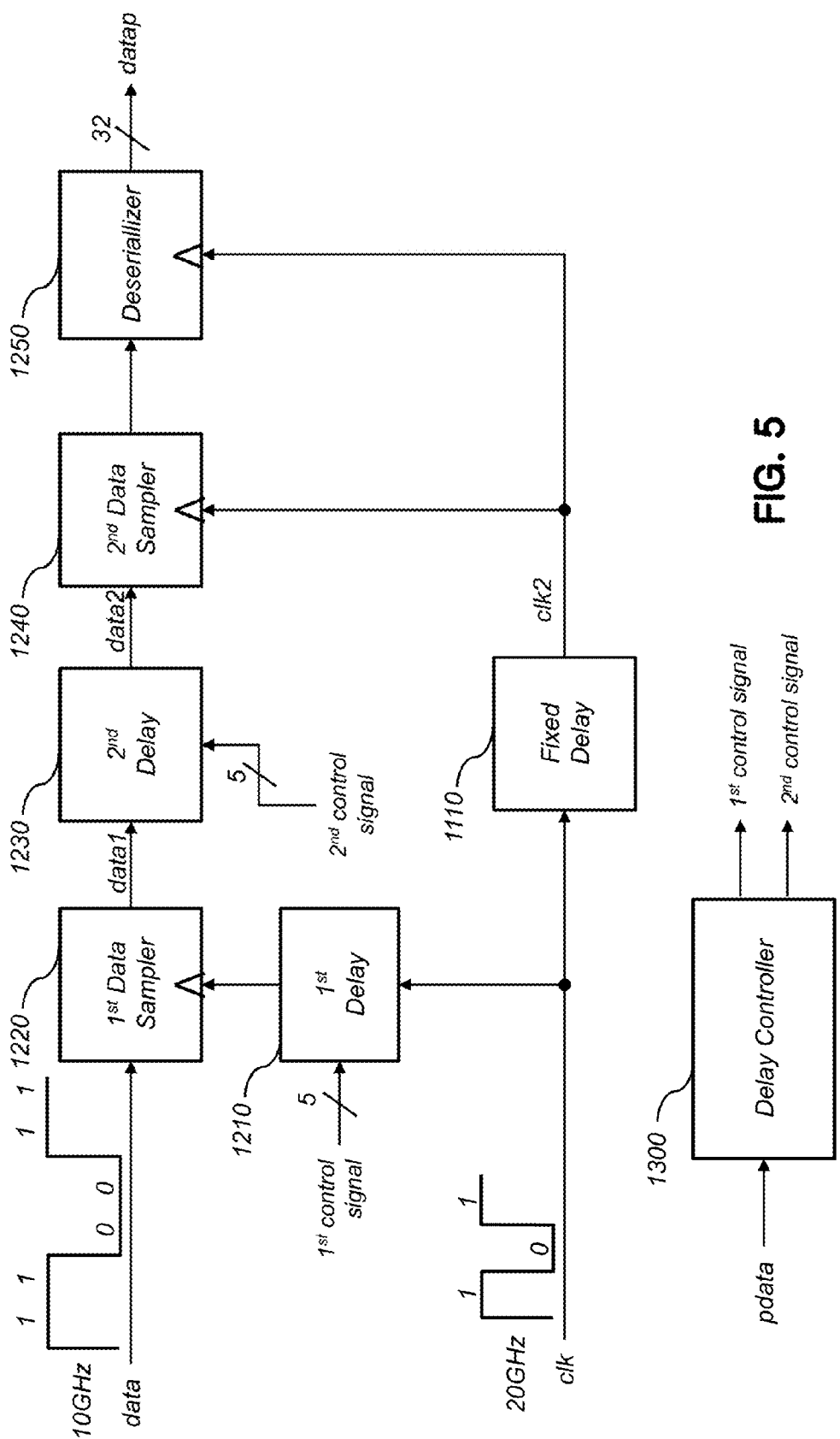
FIG. 5 shows a calibration operation of a receiver in accordance with an embodiment of the present disclosure.

FIG. 5 illustrates a calibration operation of the receiver 1000A shown in FIG. 2 in accordance with an embodiment of the present disclosure.

In the present embodiment, the calibration operation includes an operation of determining sampling points of the first and second data samplers 1220 and 1240.

The length of the delay of the second delay unit 1230 may be determined in such a manner that the second data sampler 1240 samples an intermediate point between adjacent edges of the second data signal data2, and the length of the delay of the first delay unit 1210 may be determined in such a manner that the first data sampler 1220 samples an intermediate point between adjacent edges of the data signal data. In an embodiment, an intermediate point is the center between adjacent edges of a data signal.

In the present embodiment, a clock signal transmitted from the clock channel may have a frequency of 20 GHz, and a data signal transmitted from the data channel for the calibration operation may have a Nyquist pattern of 10 GHz.

The pattern of the data outputted from the second data sampler 1240 may be checked using a 32-bit parallel signal datap outputted from the deserializer 1250. In an embodiment, there are four different data patterns, as shown in Table 1 below.

TABLE 1

| Pattern number | datap |
|---|---|
| 3 | 00110011001100110011001100110011 |
| 4 | 01100110011001100110011001100110 |
| 6 | 11001100110011001100110011001100 |
| 7 | 10011001100110011001100110011001 |

Each of the first and second control signals outputted from the delay controller 1300 is a 5-bit digital signal, and may have a value in a range of 0 to 31.

The first and second delays 1210 and 1230 may receive the 5-bit first and second control signals, respectively, and delay input signals by delay lengths corresponding to values of the first and second control signals, respectively.

The first and second delays 1210 and 1230 may adjust the lengths of the delays by selectively controlling delay paths in response to the first and second control signals, respectively. Since this configuration is known to those skilled in the art, detailed descriptions thereof are omitted herein.

The length of a unit delay of the first and second delays 1210 and 1230 may be changed depending on embodiments.

Figure 6:
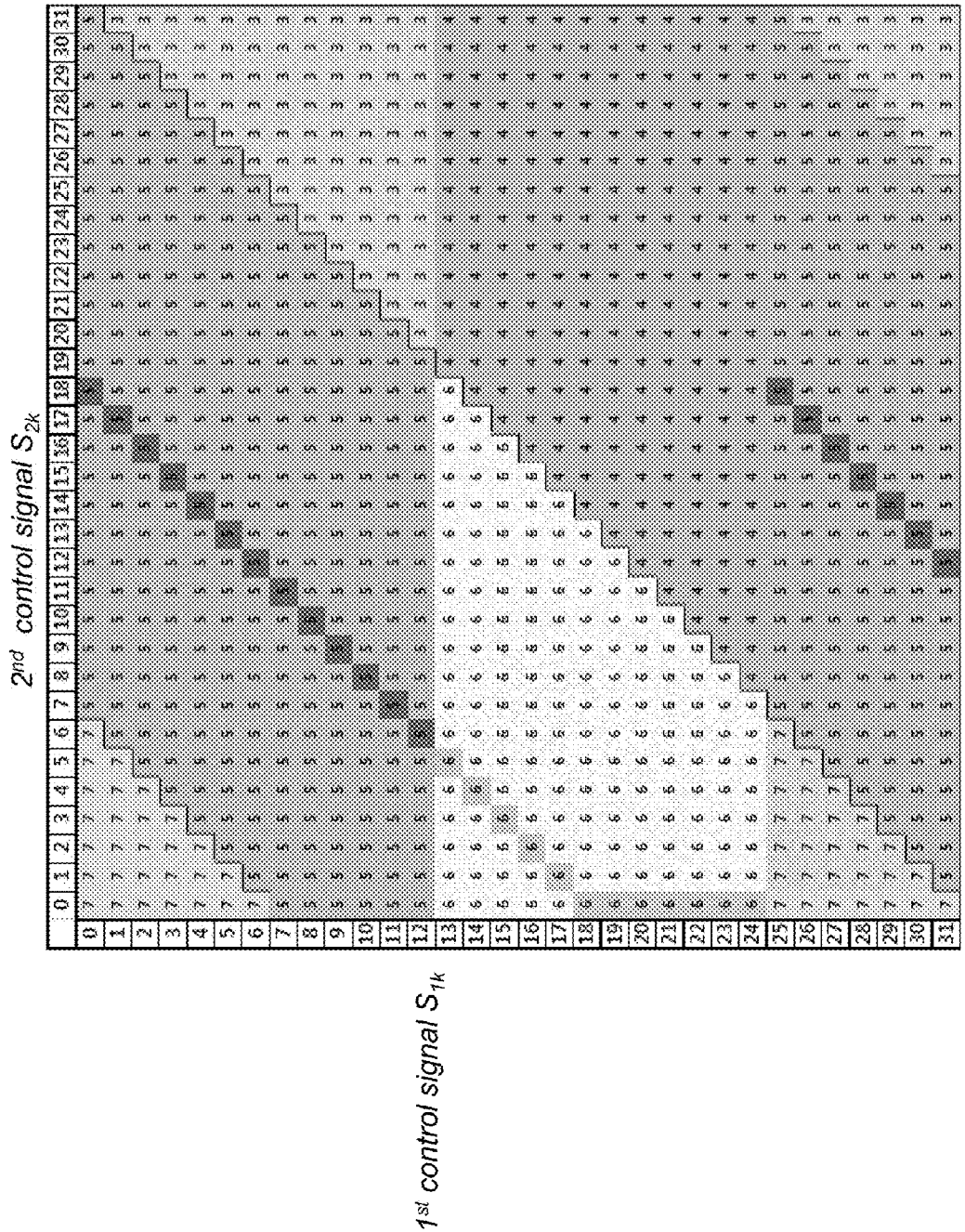
FIGS. 6 to 8 are diagrams illustrating a calibration operation of a receiver in accordance with an embodiment of the present disclosure.

FIG. 6 is a table showing data patterns corresponding to all possible values of the first and second control signals output from the delay controller 1300.

Values of the data patterns shown in FIG. 6 may be changed according to the length of the delay of the fixed delay unit 1110.

The first and second control signals $S_{1\ k}$ and $S_{2\ k}$, which are 5-bit digital signals, may have values in a range of 0 to 31, wherein k is a natural number ranging from 1 to 32.

In the present embodiment, the calibration operation may be performed in the following order: a value of the second control signal is determined corresponding to each of all possible values of the first control signal, and an optimum pair among 32 pairs of the first and second control signals is selected as the first and second control signals.

Figure 7:
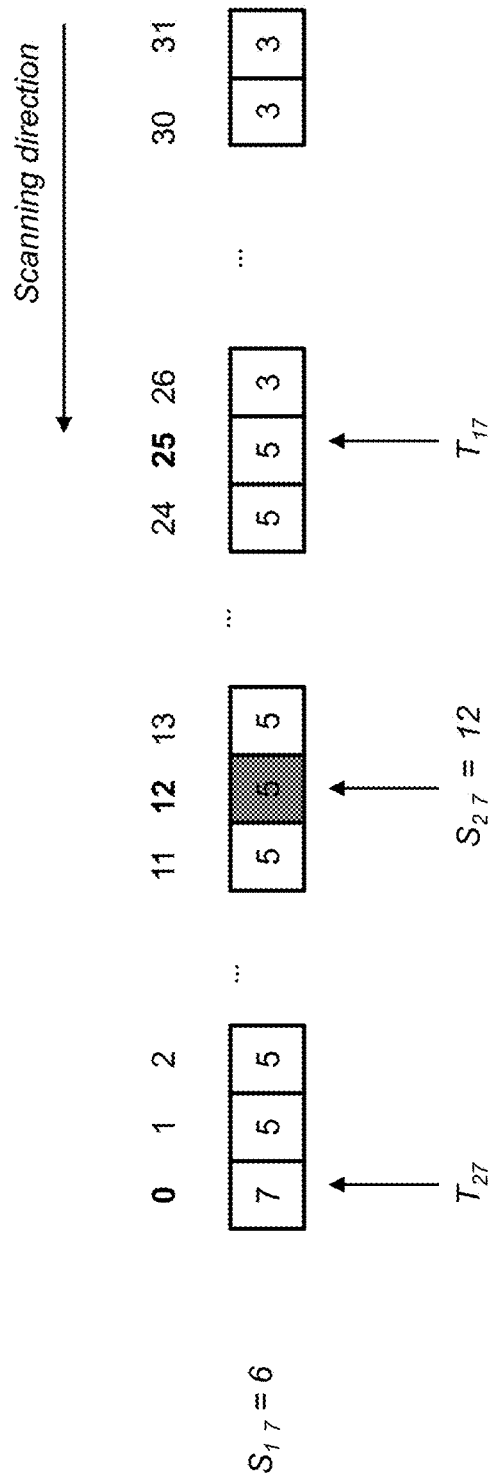

FIG. 7 is a diagram illustrating a method for determining a second control signal $S_{2\ 7}$ corresponding to a first control signal $S_{1\ 7}$ in FIG. 6.

The delay controller 1300 may observe the data change in the data pattern datap while sequentially providing 32 values, which are possible values of the second control signal, to the first and second delays 1210 and 1230 in descending order of 31 to 0, in a state in which the first control signal $S_{1\ 7}$ is set to 6.

Then, the delay controller 1300 may determine values (25, 0) of the second control signal at two points $T_{17}$ and $T_{27}$ at which data is changed, and determine an intermediate value of 12 as the value of the second control signal $S_{2\ 7}$ corresponding to the first control signal $S_{1\ 7}$.

In this way, the delay controller 1300 may determine values of the second control signals corresponding to the 32 first control signals, respectively, thereby determining 32 control signal pairs.

FIG. 7 illustrates a general case. However, in determining the pairs of the first and second control signals, an exception may exist. This exception will be described with reference to FIG. 6.

In FIG. 6, pairs of the first and second control signals are indicated with darker colors.

First, when a value of the first control signal is 0, there exists only one transition point (7→5) in a data pattern. In this case, a process of searching for a value of a second control signal corresponding to the value '0' of the first control signal may be put off, and the operation may proceed to a process of searching for a second control signal corresponding to the next first control signal.

When the value of the first control signal ranges from 1 to 6, a value of a second control signal corresponding to the first control signal may be determined in a manner as described with reference to FIG. 7.

In this case, a value of the second control signal, corresponding to the first control signal of 0, may be set to a value 18 in FIG. 6, by linearly extrapolating from other pairs determined already.

When the value of the first control signal ranges from 7 to 18, the second control signal may reach the minimum value of 0 before a second transition point is discovered. In this case, a value of a second control signal $S_{2\ k}$ may be determined in such a manner that an interval between a second control signal $S_{2\ k-1}$ determined at a previous step and a first transition point $T_{1\ k-1}$ at the previous step is equal to an interval between a second control signal $S_{2\ k}$ at the current step and a first transition point $T_{1\ k}$ at the current step. Thus, values of the second control signal corresponding to the first control signal ranging from 7 to 18 may have a tendency to monotonically increase.

When the value of the first control signal ranges from 18 to 24, it may correspond to a case in which the interval between the second control signal $S_{2\ k}$ and the first transition point $T_{1\ k}$ is smaller than the interval between the second control signal $S_{2\ k-1}$ and the first transition point $T_{1\ k-1}$. In this case, a value of the second control signal may be set to 0.

When the value of the first control signal ranges from 25 to 31, a value of the second control signal may be set in a manner as described in the general case of FIG. 7. That is, the value of the second control signal is determined as a value at an intermediate point of two points at which data is changed.

Figure 8:
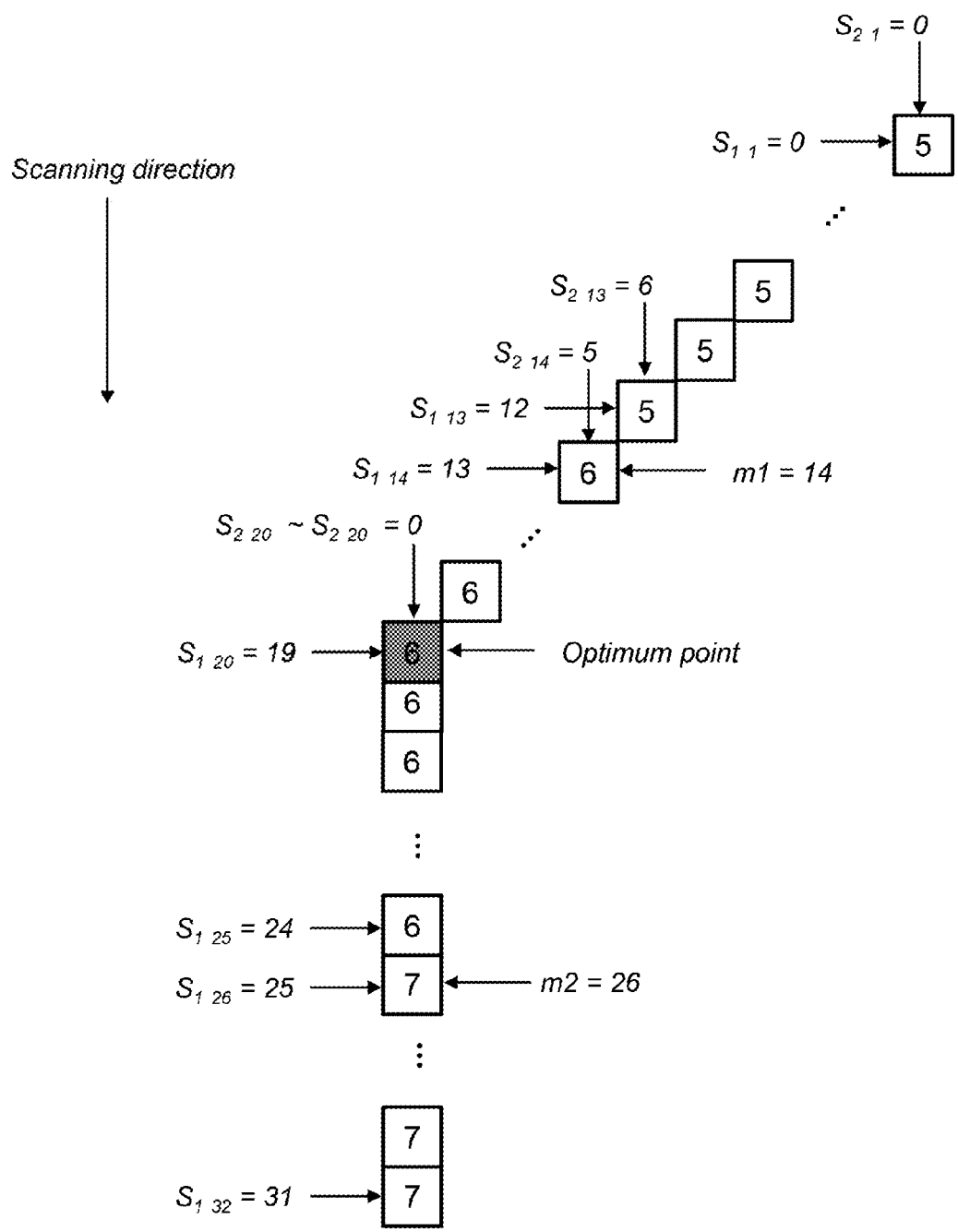

FIG. 8 is a diagram illustrating a method for determining an optimum pair of first and second control signals based on 32 pairs of the first and second control signals, which are determined as described above with reference to FIGS. 6 and 7.

The delay controller 1300 may provide the first delay unit 1210 and the second delay unit 1230 with the first control signal, which has a value increasing from 0 to 31, and the second control signal corresponding to the first control signal, respectively. The delay controller 1300 observes the data change in the data pattern data p.

Then, the delay controller 1300 may determine an optimum pair of a first control signal $S_{1\ 20}$ and a second control signal$_{2\ 20}$. The first control signal $S_{1\ 20}$ in the optimum pair has an index corresponding to an intermediate value between an index m1 (=14) of a first control signal at a first point where data is changed and an index m2 (=26) of a first control signal at a second point where data is changed. The second control signal$_{2\ 20}$ in the optimum pair is the second control signal$_{2\ 20}$ corresponding to the first control signal $S_{1\ 20}$.

In an embodiment, the optimum pair of the first and second control signals may be set to (19, 0).

In the above-described embodiment, the 32 second control signals corresponding to the 32 first control signals are searched for to determine 32 pairs of the first and second control signals as illustrated in FIG. 7, and an optimum pair of the first and second control signals is determined as illustrated in FIG. 8.

However, the processes of FIGS. 7 and 8 may be performed at the same time. For example, when a second control signal corresponding to a first control signal is found, a data pattern corresponding to the control signal pair may be recorded or stored to determine a transition point of data in a data pattern corresponding to each control signal pair. Thus, as illustrated in FIG. 8, an optimum control signal pair may be determined at a point where the second transition point is discovered.

In the above-described embodiments, after a second control signal is determined based on a first control signal, an optimum pair of the first and second control signals may be determined. However, embodiments are not limited thereto. In another embodiment, the order may be changed. That is, a first control signal may be determined based on a second control signal.

Figure 9:
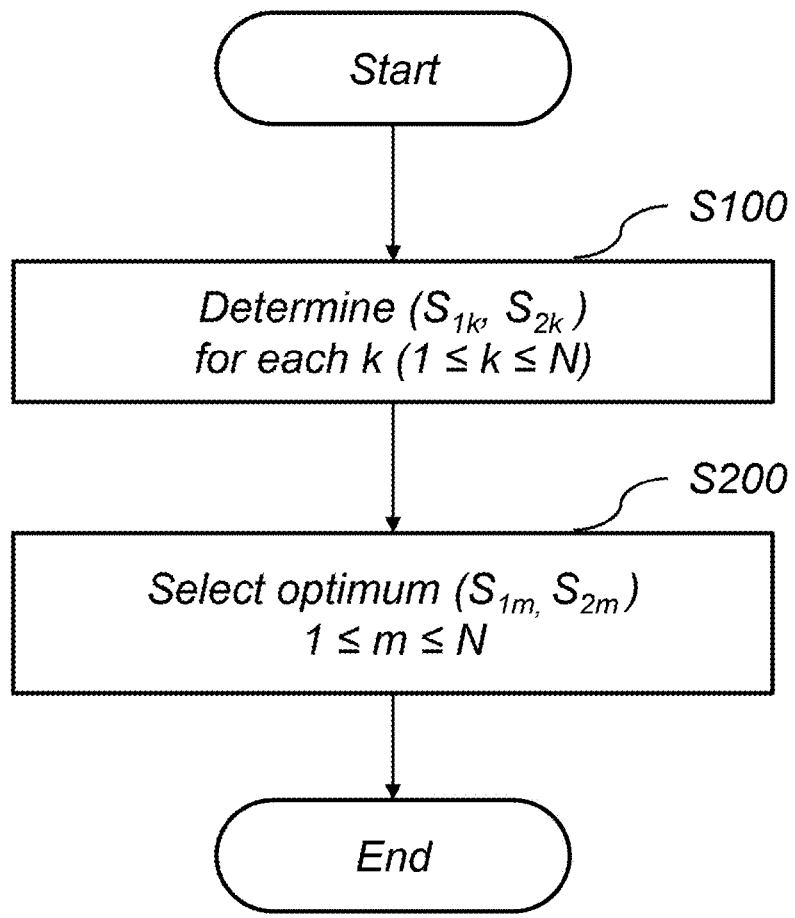
FIGS. 9 to 13 are flowcharts illustrating a calibration operation of a receiver in accordance with an embodiment of the present disclosure.

FIG. 9 is a flowchart for explaining a calibration operation of a receiver in accordance with an embodiment of the present disclosure.

At step S100, the delay controller 1300 selects second control signals $S_{2\ k}$ corresponding to N first control signals $S_{1\ k}$ so as to determine N control signal pairs ($S_{1\ k}$, $S_{2\ k}$).

At step S200, the delay controller 1300 selects an optimum control signal pair ($S_{1\ m}$, $S_{2\ m}$) among the N control signal pairs.

Since operations of FIG. 9 have been already described with reference to FIGS. 6 to 8, the description will not be reproduced with reference to FIG. 9.

Figure 10:
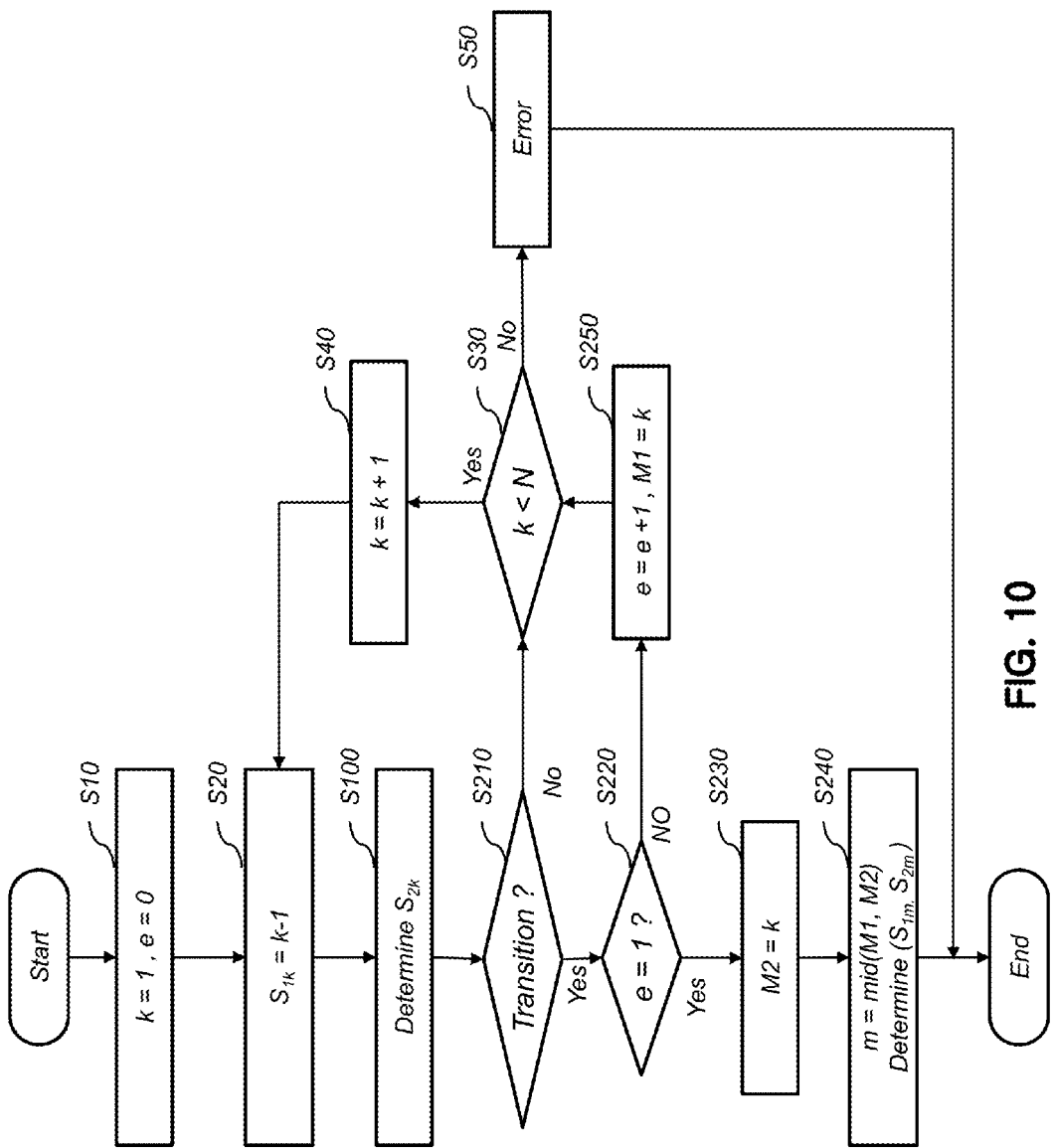

FIG. 10 is a flowchart illustrating a calibration operation in accordance with another embodiment of the present disclosure.

In FIG. 10, if an optimum control signal pair is found even before all possible control signal pairs are found as illustrated in FIG. 9, the calibration operation may be stopped.

First, the delay controller 1300 resets an index k to 1 and resets an index e to 0, at step S10.

The delay controller 1300 sets a first control signal $S_{1\ k}$ to k−1 at step S20.

Once the first control signal $S_{1\ k}$ is fixed at k−1, the delay controller 1300 determines a second control signal $S_{2\ k}$ corresponding to the first control signal $S_{1\ k}$ at step S100. In an embodiment, the second control signal $S_{2\ k}$ may be determined in the order described below with reference to FIGS. 11 and 13.

When the first control signal $S_{1\ k}$ and the second control signal $S_{2\ k}$ are determined, the delay controller 1300 checks whether there is a data transition in a data pattern datap, at step S210. In an embodiment, the delay controller 1300 may determine that there is a data transition in the data pattern datap on the basis of a data pattern datap obtained when first and second control signals $S_{1\ k-1}$ and $S_{2\ k-1}$ corresponding to the previous index are inputted. When k=1, the first and second control signals corresponding to the previous index do not exist. In this case, the delay controller 1300 may determine that no data transition occurred.

If it is determined that no data transition occurred, the delay controller 1300 determines whether the index k is smaller than N, at step S30. When k is determined to be smaller than N, the delay controller 1300 increases a value of the index k by 1, and proceeds to step S20. When k is determined to be larger than or equal to N, it may indicate that scanning is completed for all possible of the first control signal, without data transition. In this case, the delay controller 1300 displays an error at step S50, and ends the operation.

If it is determined that data transition occurred, the delay controller 1300 checks whether the index e is 1, at step S220. When the index e is 0, the delay controller 1300 increases the value of the index e by 1, and then stores the value of the index k at the transition point as M1 at step S250.

Then, the delay controller 1300 checks whether the index k is smaller than N, at step S30. When the index k is smaller than N, the delay controller 1300 increases the value of the index k by 1, and proceeds to step S20. When the index k is larger than or equal to N, it may indicate that one data transition occurred and scanning was completed for all possible values of the first control signal. In this case, the delay controller 1300 determines that there is an error at step S50, and ends the operation.

When it is determined at step S220 that the index e is 1, it may correspond to a case in which a second transition point is discovered. Thus, the delay controller 1300 stores the value of the index k at the second transition point as M2 at step S230.

Since two transition points are found, the delay controller 1300 may not generate control signal pairs corresponding to the other indexes.

Then, the delay controller 1300 determines first and second signals $S_{1\ m}$ and $S_{2\ m}$, which correspond to an index m having an intermediate value between M1 and M2, as an optimum pair of the first and second control signals at step S240. Thus, the calibration operation is completed.

Figure 11:
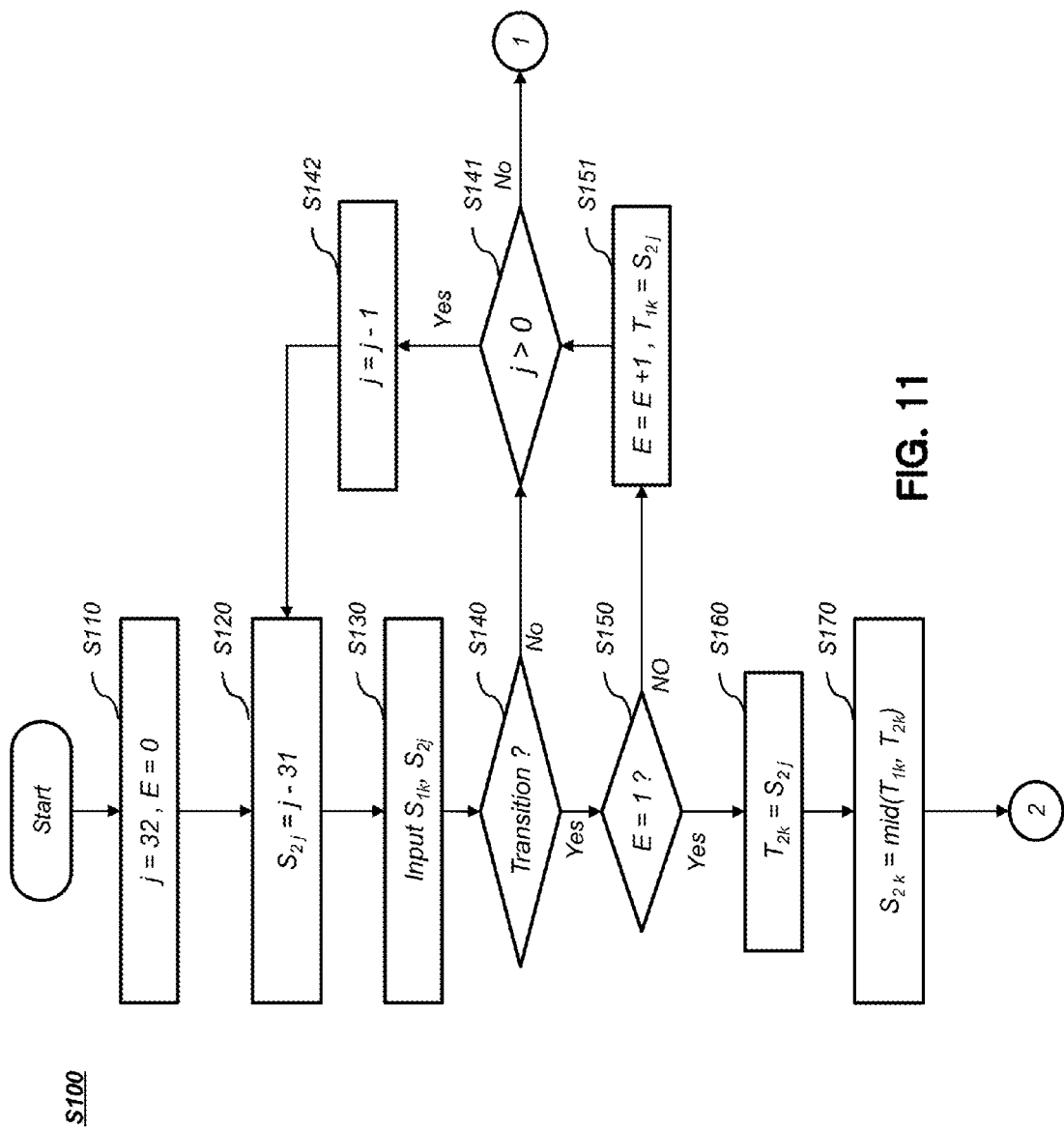
Figure 12:
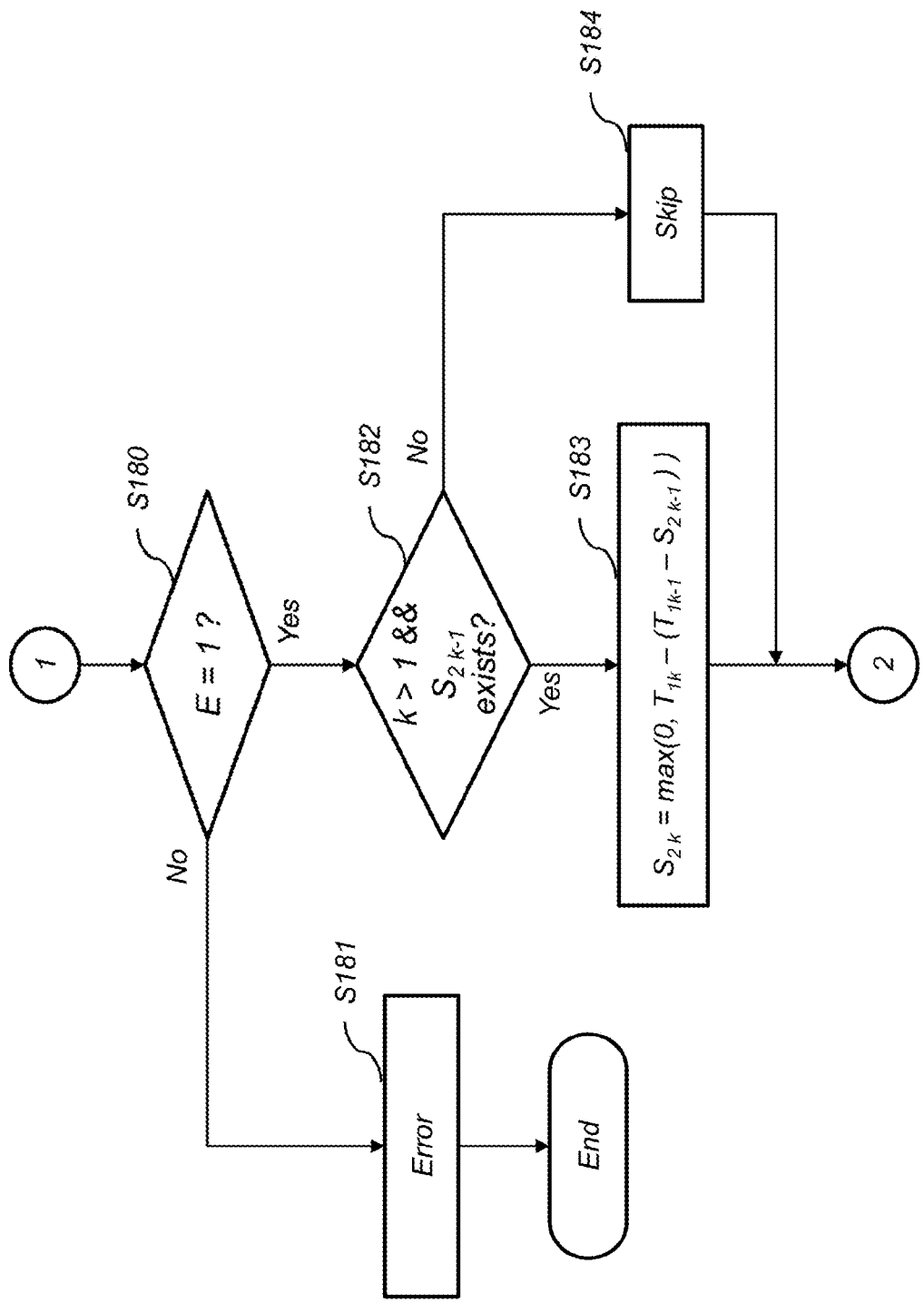
Figure 13:
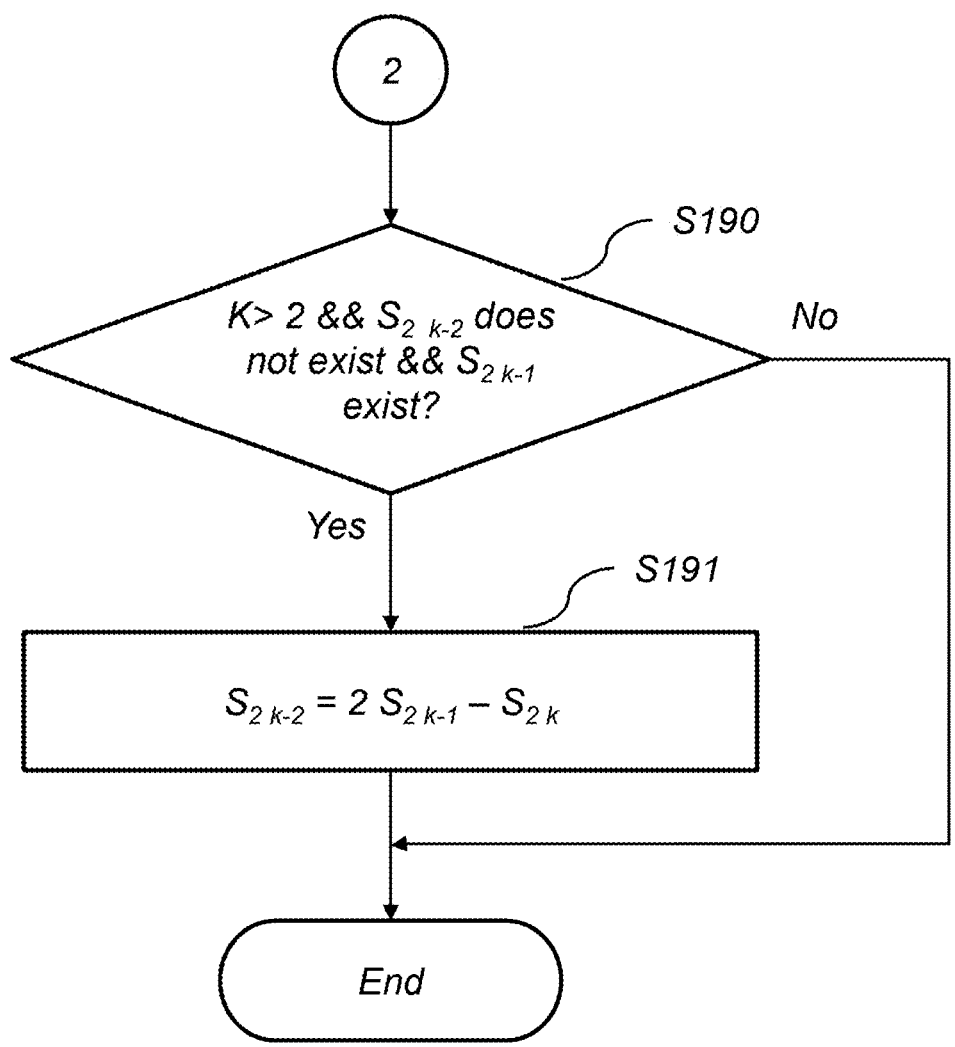

FIGS. 11 to 13 show a detailed flowchart illustrating a process of determining the second control signal $S_{2\ k}$ corresponding to the first control signal $S_{1\ k}$ at step S100 of FIG. 10 in accordance with an embodiment.

First, in FIG. 11, the delay controller 1300 resets a value of an index j to 32 and resets a value of an index E to 0, at step S110.

The delay controller 1300 sets a value of a second control signal $S_{2\ j}$ to j−31 at step S120.

Then, the delay controller 1300 inputs first and second signals $S_{1\ k}$ and $S_{2\ j}$ to the first and second delays 1210 and 1230, respectively, at step S130.

Then, the delay controller 1300 compares an output data pattern datap with a previous data pattern so as to check whether data transition occurred, at step S140. The previous data pattern may indicate a data pattern corresponding to the first control signal $S_{1\ k}$ and a second control signal $S_{2\ j-1}$ at the previous index. When j=32, it may indicate that a second control signal corresponding to the previous index does not exist. Thus, the delay controller 1300 may determine that no data transition occurred.

If it is determined that no data transition occurred, the delay controller 1300 checks whether the index j is larger than 0, at step S141. When the index j is determined to be larger than 0, the delay controller 1300 decreases the value of the index j by 1 at step S142, and proceeds to step S120.

If it is determined that data transition occurred, the delay controller 1300 checks whether the value of the index E is 1, at step S150.

If it is determined that the value of the index E is not 1, the delay controller 1300 stores a current value $S_{2j}$ as a value at a first transition point $T_{1\,k}$ at step S151.

Then, the delay controller 1300 checks whether the value of the index j is larger than 0, at step S141. If it is determined that the value of the index j is larger than 0, the delay controller 1300 decreases the index j by 1 at step S142, and proceeds to step S120.

If it is determined that the value of the index E is 1 at step S150, the delay controller 1300 stores the current value $S_{2j}$ as a value at a second transition point $T_{2\,k}$ at step S160.

When both of the two transition points are discovered, the delay controller 1300 determines an intermediate value between the two transition points $T_{1\,k}$ and $T_{2\,k}$ as a value of the second control signal $S_{2\,k}$ at step S170.

If it is determined at step S141 that the index j is 0, the delay controller 1300 proceeds to step S180 of FIG. 12. This may indicate that the number of discovered transition points is 1 or 0 and all possible values of the second control signal are scanned. Thus, the delay controller 1300 proceeds to step S180 of FIG. 12.

At step S180, the delay controller 1300 checks whether the value of the index E is 1.

If it is determined that the value of the index E is not 1, the value of the index E may correspond to 0. In this case, the delay controller 1300 determines that there is an error at step S181, and ends the operation.

On the other hand, if it is determined that the value of the index E is 1, the delay controller 1300 checks whether the index k is larger than 1 and a value of the second control signal $S_{2\,k-1}$ at the previous index exists, at step S182.

If it is determined that the index k is larger than 1 and the value of the second control signal $S_{2\,k-1}$ at the previous index exists, the delay controller 1300 determines the value of the second control signal $S_{2\,k}$ as expressed by Equation 1 below, and proceeds to step S190 of FIG. 13.

$$S_{2k} = \max(0, T_{1k} - (T_{1k-1} - S_{2k-1}))$$ [Equation 1]

If it is determined that the index k is not 1 or the value of the second control signal $S_{2\,k-1}$ at the previous index does not exist, the delay controller 1300 does not determine the value of the second control signal, but proceeds to step S190 of FIG. 13.

Step S190 is used to determine the value of the second control signal, which has not been determined for the previous index, based on the values of the second control signals which have been determined. The delay controller 1300 checks whether the value of the index k is larger than 2, the second control signal $S_{2\,k-1}$ corresponding to the previous index exists, and the second control signal $S_{2\,k-2}$ corresponding to the index before the previous index does not exist, at step S190.

If one or more of the conditions provided at step S190 are not satisfied, the delay controller 1300 ends the operation. On the other hand, if all of the conditions provided at step S190 are satisfied, the delay controller 1300 determines the value of the second control signal $S_{2\,k-2}$ corresponding to the index before the previous index as a value of Equation 2 below at step S191, and ends the operation.

$$S_{2k-2} = 2S_{2k-1} - S_{2k}$$ [Equation 2]

In accordance with embodiments of the present disclosure, a receiver, a system including the same, and a calibration method thereof may reduce an area and power consumption of a circuit and reduce noise caused by a transmission line, compared to a conventional receiver.

Although various embodiments have been described for illustrative purposes, it will be apparent to those skilled in the art that various changes and modifications may be made without departing from the spirit and scope of the invention as defined in the following claims.

What is claimed is:

1. A receiver comprising:
   a fixed delay unit configured to delay a first clock signal received from a clock channel by a predetermined time and output a second clock signal;
   a first delay unit configured to delay the first clock signal in response to a first control signal;
   a first data sampler configured to sample a data signal received from a data channel in response to an output signal of the first delay unit and output a first data signal;
   a second delay unit configured to delay the first data signal in response to a second control signal and output a second data signal;
   a second data sampler configured to sample the second data signal in response to the second clock signal; and
   a delay controller configured to output the first control signal and the second control signal.

2. The receiver of claim 1, wherein the delay controller performs a calibration operation, the calibration operation including determining the first and second control signals based on a pattern of data outputted from the second data sampler while a test signal is received from the data channel.

3. The receiver of claim 2, wherein the delay controller determines the first control signal to allow the first data sampler to sample a first point between adjacent edges of the test signal, and determines the second control signal to allow the second data sampler to sample a second point between adjacent edges of the second data signal.

4. The receiver of claim 3, wherein the first point corresponds to the center between the adjacent edges of the test signal, and the second point corresponds to the center between the adjacent edges of the second data signal.

5. The receiver of claim 3, wherein, when a k-th first signal $S_{1\,k}$ is inputted as the first control signal, wherein k ranges from 1 to N and N is a natural number equal to or larger than 1, the delay controller selects a second signal $S_{2\,k}$, through which the second data sampler samples the second point, as the second control signal so as to determine a k-th signal pair of the first and second signals $S_{1\,k}$ and $S_{2\,k}$, and determines an m-th signal pair $S_m$ of first and second signals $S_{1\,m}$ and $S_{2\,m}$, through which the first data sampler samples the first point, among N signal pairs as the first and second control signals, wherein m is a natural number equal to or less than N.

6. The receiver of claim 3, wherein, when a k-th second signal $S_{2\,k}$ is inputted as the second control signal, wherein k ranges from 1 to N and N is a natural number equal to or larger than 1, the delay controller selects a first signal $S_{1\,k}$, through which the first data sampler samples the first point, as the first control signal so as to determine a k-th signal pair of the first and second signals $S_{1\,k}$ and $S_{2\,k}$, and determines an m-th signal pair $S_m$ of first and second signals $S_{1\,m}$ and $S_{2\,m}$, through which the second data sampler samples the second point, among N signal pairs as the first and second control signals, wherein m is a natural number equal to or less than N.

7. The receiver of claim 1, further comprising:
a first equalizer configured to equalize a signal received from the clock channel and output the first clock signal; and
a second equalizer configured to equalize a signal received from the data channel and provide the equalized signal to the first data sampler.

8. A system comprising:
a transmitter comprising a clock transmitter configured to transmit a clock signal to a clock channel and a data transmitter configured to transmit a data signal to a data channel; and
a receiver comprising a clock receiver configured to receive the clock signal from the clock channel and a data receiver configured to receive the data signal from the data channel,
wherein the clock receiver comprises a fixed delay unit configured to delay a first clock signal received from the clock channel by a predetermined time and output a second clock signal, the first clock signal being the clock signal received from the clock channel, and
wherein the data receiver comprises:
a first delay unit configured to delay the first clock signal in response to a first control signal;
a first data sampler configured to sample the data signal received from the data channel in response to an output signal of the first delay and output a first data signal;
a second delay unit configured to delay the first data signal in response to a second control signal and output a second data signal;
a second data sampler configured to sample the second data signal in response to the second clock signal; and
a delay controller configured to output the first control signal and the second control signal.

9. The system of claim 8, wherein the delay controller performs a calibration operation, the calibration operation including determining the first and second control signals based on a pattern of data outputted from the second data sampler while a test signal is received from the data channel.

10. The system of claim 9, wherein the delay controller determines the first control signal to allow the first data sampler to sample a first point between adjacent edges of the test signal, and determines the second control signal to allow the second data sampler to sample a second point between adjacent edges of the second data signal.

11. The system of claim 10, wherein, when a k-th first signal $S_{1\,k}$ is inputted as the first control signal, wherein k ranges from 1 to N and N is a natural number equal to or larger than 1, the delay controller selects a second signal $S_{2\,k}$, through which the second data sampler samples the second point, as the second control signal so as to determine a k-th signal pair of the first and second signals $S_{1\,k}$ and $S_{2\,k}$, and determines an m-th signal pair $S_m$ of first and second signals $S_{1\,m}$ and $S_{2\,m}$, through which the first data sampler samples the first point, among N signal pairs as the first and second control signals, wherein m is a natural number equal to or smaller than N.

12. The system of claim 10, wherein, when a k-th second signal $S_{2\,k}$ is inputted as the second control signal, wherein k ranges from 1 to N and N is a natural number equal to or larger than 1, the delay controller selects a first signal $S_{1\,k}$, through which the first data sampler samples the first point, as the first control signal so as to determine a k-th signal pair of the first and second signals $S_{1\,k}$ and $S_{2\,k}$, and determines an m-th signal pair $S_m$ of first and second signals $S_{1\,m}$ and $S_{2\,m}$, through which the second data sampler samples the second point, among N signal pairs as the first and second control signals, wherein m is a natural number equal to or smaller than N.

13. The system of claim 8, wherein the clock receiver further comprises a first equalizer configured to equalize a signal received from the clock signal and output the first clock signal, and the data receiver further comprises a second equalizer configured to equalize a signal received from the data channel and provide the equalized signal to the first data sampler.

14. A calibration method of a receiver, which includes a fixed delay unit configured to delay a first clock signal received from a clock channel by a predetermined time and output a second clock signal; a first delay unit configured to delay the first clock signal in response to a first control signal; a first data sampler configured to sample a data signal received from a data channel in response to an output signal of the first delay unit and output a first data signal; a second delay unit configured to delay the first data signal in response to a second control signal and output a second data signal; a second data sampler configured to sample the second data signal in response to the second clock signal; and a delay controller configured to output the first control signal and the second control signal, wherein the delay controller determines the first control signal and the second control signal based on a pattern of data outputted from the second data sampler while a test signal is received from the data channel, the calibration method comprising:
a first step of determining a second signal $S_{2\,k}$ which corresponds to the second control signal, when a first signal $S_{1\,k}$ is provided as the first control signal, wherein k ranges from 1 to N and N is a natural number equal to or larger than 1; and
a second step of selecting any one signal pair $S_m$ among a plurality of signal pairs $S_{1\,k}$ and $S_{2\,k}$ and determining the selected signal pair as the first control signal and the second control signal, wherein m ranges from 1 to N.

15. The calibration method of claim 14, wherein the first step comprises:
searching for a first point $T_{1\,k}$ at which data transition occurs in the pattern of the data outputted from the second data sampler while sequentially decreasing a value of the second control signal from a maximum value of the second control signal in a state of providing the first signal $S_{1\,k}$ as the first control signal;
searching for a second point $T_{2\,k}$ at which data transition occurs in the pattern of the data while sequentially decreasing the value of the second control signal to a minimum value of the second control signal after the first point $T_{1\,k}$, and setting the minimum value to the second point $T_{2\,k}$ when the data transition does not occur in the pattern of the data; and
determining any one of the first point $T_{1\,k}$, the second point $T_{2\,k}$, and an intermediate value therebetween as the second signal $S_{2\,k}$.

16. The calibration method of claim 15, wherein determining any one of the first point $T_{1\,k}$, the second point $T_{2\,k}$, and the intermediate value therebetween comprises determining the intermediate value between the first point $T_{1\,k}$ and the second point $T_{2\,k}$ as the second signal $S_{2\,k}$ when the second point $T_{2\,k}$ is larger than the minimum value.

17. The calibration method of claim 14, wherein the second step comprises:
arranging the plurality of signal pairs $S_{1\,k}$ and $S_{2\,k}$ according to a magnitude of the first signal $S_{1\,k}$, and searching for third and fourth points M1 and M2 at which data transition occurs in the pattern of the data while the first signal $S_{1\ k}$ and the second signal $S_{2\ k}$ corresponding to the first signal $S_{1\ k}$ are provided as the first control signal and the second control signal, respectively; and determining a signal pair $S_m$ of first and second signals $S_{1\ m}$ and $S_{2\ m}$, corresponding to any one value of the third and fourth points M1 and M2, as the first and second control signals.

18. The calibration method of claim 17, wherein the signal pair $S_m$ is between the third and fourth points M1 and M2.

* * * * *